(12) United States Patent
Sugizaki et al.

(10) Patent No.: US 6,495,752 B1
(45) Date of Patent: Dec. 17, 2002

(54) ELECTRIC WAVE SHIELDING MATERIAL

(75) Inventors: Toshio Sugizaki; Yasukazu Nakata; Satoshi Sakurai, all of Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 09/273,465

(22) Filed: Mar. 22, 1999

(30) Foreign Application Priority Data

Mar. 19, 1998 (JP) .......................................... 10-069929

(51) Int. Cl.$^7$ ................................................ H05K 9/00
(52) U.S. Cl. ................................................ 174/35 MS
(58) Field of Search ......................... 174/35 MS, 35 R; 361/816, 818; 315/85

(56) References Cited

U.S. PATENT DOCUMENTS 4,247,737 A * 1/1981 Johnson et al. ......... 174/35 MS

FOREIGN PATENT DOCUMENTS

| EP | 0 550 373 | | 7/1993 |
| JP | 59-78696 | * | 5/1984 |

OTHER PUBLICATIONS

Patent Abstracts of Japan, vol. 1998, No. 4, JP 09 321485 A, "Electromagnetic Wave Shielding Device", Appl. No. 08/136,915, Appl. Date: May 3, 1996.

Patent Abstracts of Japan, vol. 1998, No. 05, JP 10 013083 A, "Electromagnetic Wave Absorber", Appl. No. 08/167,699, Appl. Date: Jun. 27, 1996.

* cited by examiner

Primary Examiner—Dean A. Reichard
Assistant Examiner—Hung V Ngo
(74) Attorney, Agent, or Firm—Liniak, Berenato, Longacre & White

(57) ABSTRACT

An electric wave shielding material provided to be adhered to a window. The material includes a body member composed of a light transmitting surface material; a light transmitting electrically conductive layer provided on the light transmitting surface material; and a light transmitting adhesive provided on at least a part of the light transmitting electrically conductive layer in such a manner that a part of the light transmitting electrically conductive layer is exposed to form a connecting electrically conductive portion. A connecting piece composed of a member for converting an electric wave into a heat energy is connected to the connecting electrically conductive portion, and includes an adhesive layer.

8 Claims, 2 Drawing Sheets

ELECTRIC WAVE SHIELDING MATERIAL

FIELD OF THE INVENTION

This invention relates to an electric wave shielding material to be stuck to a window of construction or a moving vehicle, such as an automobile, a train, and an airplane, to shield an electric wave. More particularly, the invention concerns an electric wave shielding material excelling in operability of the application and capable of ensuring the shielding of the electric waves.

BACKGROUND OF THE INVENTION

In conventional, as electric wave shielding materials for use in the window of the construction and the wall in room of hospital, various types have been suggested. One example includes an electric wave shielding material for wall disclosed in Japanese Utility Model Laid-Open No. 59-78696 in which a metal foil is laminated on the top surface of a backing material via an adhesive, and a flexible synthetic resin is further laminated on the top surface of the metal foil via an adhesive.

Also suggested is an electric wave shielding material, in which a room to be applied is perfectly covered with an electrically conductive material such as a metal foil made, e.g., of copper or aluminum, or carbon fiber during the course of construction to thereby carry out the electric shielding.

However, these electric wave shielding materials are used for the purpose of being applied to walls, etc., and they cannot be applied to a window, which requires a transparency.

As the electric wave shielding material for applicable to a window, it has been known that an electric wave shielding paint which is of a light transmitting is applied to a window. The electric wave shielding paint shields an electric wave by applying it to a site required for shielding an electric wave such as a window. Such a type of the electric shielding paint is disadvantageous in that the skill is required to uniformly apply the electric shielding paint, and the application thereof is worse in the working efficiency.

In addition to the electric wave shielding materials which shield all of electric waves, the development of an electric wave shielding material which can selectively shields an electric wave having a specific wavelength region has been highly desired.

SUMMARY OF THE INVENTION

An object of the present invention is, therefore, to provide an electric wave shielding material which can be stuck with ease, which ensures the shielding of electric wave, and which can be stuck to a site such as a window glass at which a transparency is required. Another object of the present invention is to provide an electric wave shielding material, which can selectively shield an electric wave having a specific wavelength region.

According to the first aspect of the present invention, there is provided an electric wave shielding material to be utilized with being stuck to an adherend, which comprises:

- a body member composed of a light transmitting surface material;
- a light transmitting electrically conductive layer provided on said light transmitting surface material (hereinafter sometimes referred to as the "surface material"); and a light transmitting adhesive layer provided on at least a part of said light transmitting electrically conductive layer in such a manner that a part of said light transmitting electrically conductive layer is exposed to form a connecting electrically conductive portion; and
- a connecting piece having a member for converting an electric wave into a heat energy for being connected to said connecting electrically conductive portion, and having an adhesive layer provided on one surface of said member for converting an electric wave into a heat energy.

According to the second aspect of the invention, there provided an electric wave shielding material to be utilized with being stuck to an adherend, which comprises: a light transmitting surface material, a light transmitting electrically conductive layer provided on one surface of the surface material, a member for converting an electric wave into a heat energy connected to said light transmitting electrically conductive layer and a light transmitting adhesive layer provided on at least part of said surface material, said light transmitting electrically conductive layer or said member for converting an electric wave into a heat energy.

The third aspect of the present invention concerns an electric wave shielding material to be utilized with being stuck to an adherend, which comprises: a light transmitting surface material, at least one electrically conductive layer, which resonates at a prescribed wavelength region, provided on one surface of the surface material, and a member for converting an electric wave into a heat energy provided in such a manner that it is connected to the electrically conductive layer, which also comprises an adhesive layer provided on one or the other surface of the surface material.

DESCRIPTION OF THE PREFERRED EMBODIMENTS

Embodiments of the present invention will now be described by referring to the attached drawings.

First, a first aspect of the present invention will be described with reference to FIG. 1.

Figure 1:
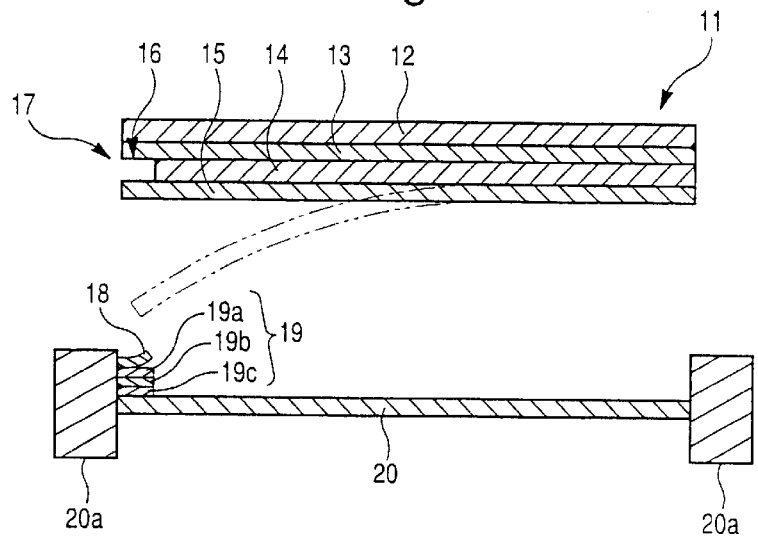
FIG. 1 is a cross-sectional view showing an electric wave shielding material according to one aspect of the present invention.

As shown in FIG. 1, the electric wave shielding material 11 of the first aspect of the present invention is composed of a body member 17 and a connecting piece 19 which is formed separately from the body member 17. The body member 17 comprises a light transmitting surface material 12, a light transmitting electrically conductive layer 13 provided on one surface of the surface material 12, a light transmitting adhesive layer 14 provided on at least a part of the light transmitting electrically conductive layer 13 in such a manner that a part of the light transmitting electrically conductive layer 13 is exposed to form a connecting electrically conductive portion 16, and a release liner 15. The connecting piece 19 possesses a member for converting an electric wave into a heat energy.

(Surface Material)

The surface material 12 is provided for the purpose of protecting the surface of the electric wave shielding material according to the present invention, and preventing the inter layers from being exposed, and is required to have light transmitting property. The surface material 12 which can be used in the present invention is not restricted as long as it meets the above conditions. Examples include, but are not restricted to, films produced from polyethylene terephthalate, polyethylene, polypropylene, polystyrene, polyvinyl chloride, and polyethylene naphthate. Preference is given to use a film from polyethylene terephthalate or polyolefin, in terms of the fact that no harmful substance is generated even if it is burned off and it can easily be obtained. The thickness of the film is not restricted as long as the objects and the effects of the presented invention can be obtained. The thickness is freely selected considering the applicability of the film, light transmitting property, the total thickness of the electric wave shielding material of the present invention, and any other factors, and generally in the range of from 10 to 1,000 $\mu$m, preferably 25 to 200 $\mu$m, and particularly approximately 50 $\mu$m.

(Light Transmitting Electrically Conductive Layer)

The light transmitting electrically conductive layer 13 is a layer for the purpose of shielding an electric wave to be shielded, and is composed, e.g., of indium tin oxide (hereinafter abbreviated as "ITO"), metals such as aluminum, gold, silver, copper, nickel, iron, and tin, and metal oxides thereof, and organic electrically conductive agents such as polypyrrole, polyaniline, and polyacetylene. For example, in the case of using a metal or an oxide thereof, such as ITO as the electrically conductive layer 13, it is deposited on the surface of the surface material 12 so as to be a desired thickness by a method well known in the art. The thickness of the light transmitting electrically conductive layer depends on the metal or the oxide thereof used, and generally speaking it is preferably in the range of from 0.1 to 10 $\mu$m. If the thickness is less than 0.1 $\mu$m, the electric wave shielding properties is undesirably reduced. Conversely, if it exceeds 10 $\mu$m, the light transmitting property is undesirably reduced, particularly in the case where the electric wave shielding material is to be stuck to a window portion required for securing visibility.

The formation of the light transmitting electrically conductive layer 13 is not restricted as long as the electrically conductive layer can be suitably formed, such as deposition, sputtering, plating, printing.

(Light Transmitting Adhesive Layer)

The light transmitting adhesive layer 14 is provided on the laminate composed of the surface material 12 and the light transmitting electrically conductive layer 13. The light transmitting adhesive layer 14 is provided for the purpose of sticking the electric wave shielding material according to the present invention onto the adherend such as a window, and is required to have a light transmitting property. The adhesive for forming such a light transmitting adhesive layer 14 is not specially restricted as long as it possesses a light transmitting property, and examples include acrylic adhesives, epoxy adhesives, rubber adhesives, silicone adhesives, polyurethane adhesives, polyethylene heat sealing adhesives, and the like.

The light transmitting adhesive layer 14 may be provided on the whole of the rear surface of the light transmitting electrically conductive layer 13, or may be provided on the rear surface at several intervals. The thickness of the adhesive layer is also not specifically restricted as long as it is a thickness for securely sticking the electric wave shielding material according to the present invention on the adherend, and for example it is in the range of from 5 to 50 $\mu$m.

(Connecting Electrically Conductive Portion)

In the first aspect of the present invention, a connecting electrically conductive portion 16 is formed at one end of the light transmitting electrically conductive layer 13 in such a manner that a part of light transmitting electrically conductive layer 13 is exposed. The connecting electrically conductive portion 16 is a layer formed for the purpose of directly connecting the light transmitting electrically conductive layer 13 to the connecting piece 19, which will be described below. The width of the connecting electrically conductive portion 16 is freely selected depending upon the connecting piece, and generally is approximately 2 cm.

(Connecting Piece)

The electric wave shielding material according to the first aspect of the present invention is composed of the body member 17 and the connecting piece 19. The connecting piece 19 is composed of a member for converting an electric wave into a heat energy, and is provided for the purpose of converting the electric wave absorbed on the body member 17 into a heat energy.

To be specific, the connecting piece 19 is composed mainly of a center layer 19b based on a plastic film such as polyurethane, polyvinyl chloride, or polystyrene, or nonwoven fabric into which a member for converting an electric wave into a heat energy such as carbon powder or ferrite is incorporated. On one side of the center layer 19b, a layer 19a comprising an electrically conductive adhesive is provided and the other side of the center layer 19b, a layer 19c comprising acrylic adhesive is provided. A release liner is provided on each of the electrically conductive adhesive layer. When used, the release liners are peeled to stick the connecting piece to the window and to the connecting electrically conductive portion 16. The connecting piece is formed into the width substantially the same as that of the connecting electrically conductive portion 16.

In general, the content of the member for converting an electric wave into a heat energy such as carbon powder or ferrite is from 10 to 1,000 parts by weight, based on 100 parts by weight of the base plastic film or base nonwoven fabric.

It is advantageous that the electrically conductive adhesive 19a and the acrylic adhesive 19c are previously laminated with release liners, respectively, and each of the release liners is removed when used, making it possible to easily operate these adhesives.

Now the procedure of sticking the electric wave shielding material 11 according to the first aspect of the present invention onto a window will now be described.

First, the connecting piece 19 is stuck such a manner that the connecting piece 19 is brought into contact with the frame 20a of the window 20, then the release liner 18 is removed from the connecting piece 19. Subsequently, the release liner 15 is removed from the body member 17, and the body member 17 is stuck onto the window 20 via the adhesive layer 14 in such a manner that the surface of the connecting electrically conductive portion 16 is superposed on the electrically conductive adhesive 19a of the connecting piece 19.

As described above, it becomes easy to stick the electric wave shielding material 11 in a suitable state. The electric wave such as from a portable phone, which will be penetrated through the window is transmitted to the polyurethane film 19b via the electrically conductive layer 13 of the electric wave shielding material 11, and the electric wave is then converted into heat energy by means of carbon powder contained in the polyurethane film 19b.

Next, the second aspect of the present invention will now be described by referring to FIGS. 2A, 2B, 2C.

Figure 2A:
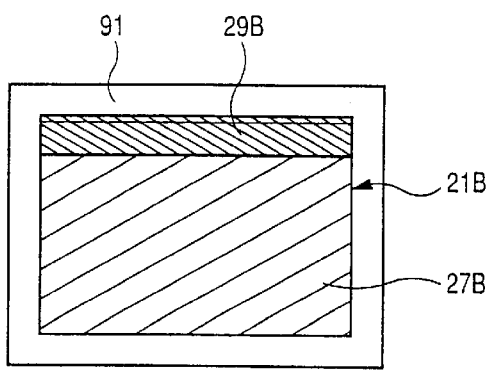
FIGS. 2A & 2C are front views showing an electrical wave shielding material according to another aspect of the present invention.
Figure 2C:
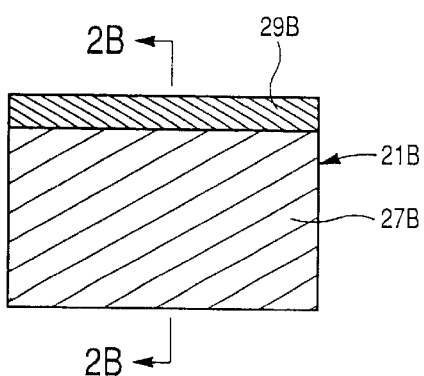
Figure 2B:
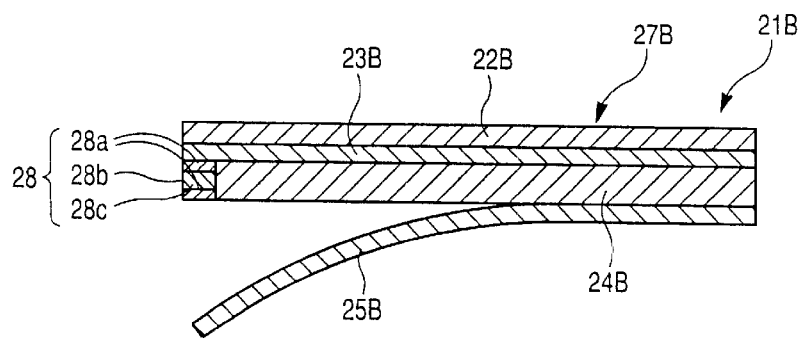
FIG. 2B is a cross-sectional view of the electric wave shielding material taken along line 2C–2C of FIG. 2C at the center portion.

As shown in FIG. 2A and FIG. 2B, the electric wave shielding material 21B according to the second aspect of the present invention is composed of a light transmitting surface material 22B, a light transmitting electrically conductive layer 23B provided on one surface of the surface material 22B, a member 28b for converting an electric wave into a heat energy provided on one end of the light transmitting electrically conductive layer 23B via electrically conductive adhesives 28a, a light transmitting adhesive layer 24B provided on one surface of the light transmitting electrically conductive layer 23B, and an adhesive layer 28C provided on the member 28b for converting an electric wave into a heat energy.

A difference between the electric wave shielding materials according to the first aspect and the second aspect of the present invention is that whereas the connecting piece containing the member for converting an electric wave into a heat energy is separately provided in the first aspect of the present invention, they are provided together by connecting them in the second aspect of the present invention. Therefore, the surface material 22B, the light transmitting adhesive layer 24B, the light transmitting electrically conductive layer 23B and the method of the construction of them are similar to those of the first aspect of the present invention. So, repeated description should be omitted.

As shown in FIG. 2A, in the case where the electric wave shielding material 21B according to the second aspect of the present invention is stuck for example to a window, which is an adherend, the sticking is carried out according to the flowing procedure: The whole of the electric wave shielding material 21B is stuck on the window in such a manner that circumference of the electric wave shielding material 21B is along with the frame 91 to cover the whole surface of the window with the electric wave shielding material 21B. At this time, even if the frame is made of metal or wood, when the electric wave shielding material is suitably stuck, an electric wave to be penetrated though the widow is transmitted to the polyurethane film 28b via the electrically conductive layer 23B, and then the electric wave is converted into a heat energy by means of carbon powder contained in the polyurethane film 28b. For this reason, appropriate electric wave shielding can be realized.

Next, the third aspect of the present invention will now be described by referring to FIG. 3.

Figure 3A:
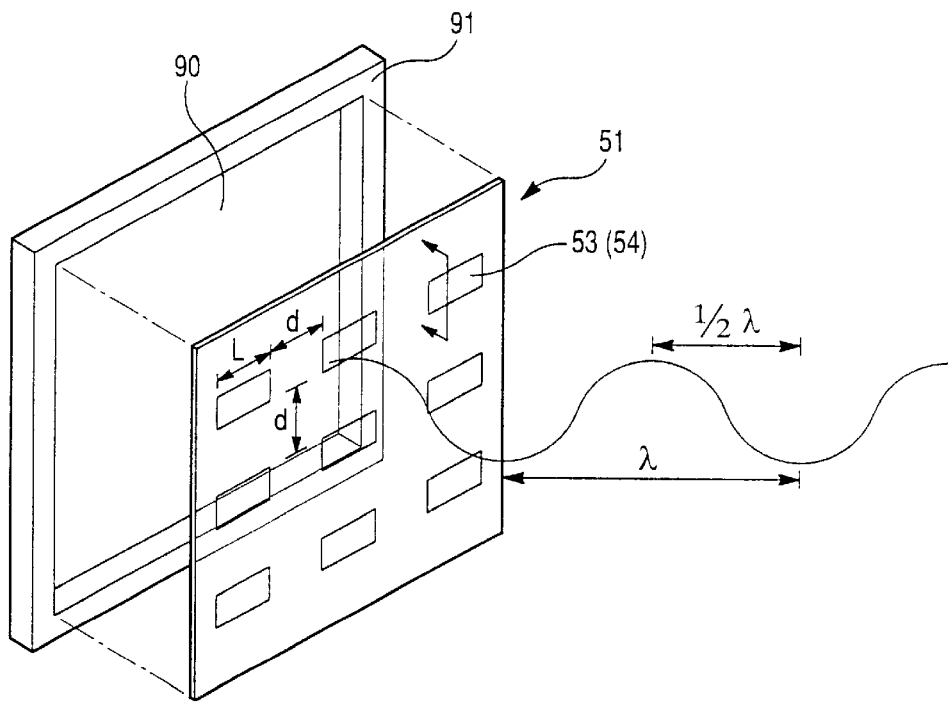
FIG. 3A and FIG. 3B each is a perspective view and a cross-sectional view showing an electric wave shielding material according to still another aspect of the present invention.
Figure 3B:
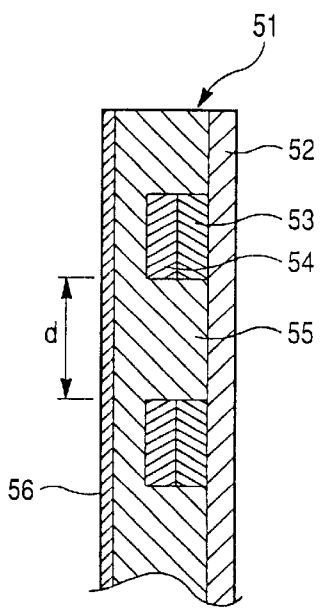

As shown in FIG. 3A and FIG. 3B, the electric wave shielding material 51 according to the third aspect of the present invention is stuck to a window 90. It is composed of a plurality of electrically conductive layers 53, which resonate at a prescribed electric wavelength region to be shielded. The electrically conductive layers 53 are arranged on the surface material 52 so that the distance d between the electrically conductive layers 53 is less than half of the wavelength λ to be shielded. The size, L, of the electrically conductive layer 53 in the width direction is formed so as to be half of the wavelength λ to be shielded. Further, a polyurethane film 54 into which carbon powder which is a member for converting an electric wave into a heat energy is incorporated is provided on the rear surface of the electrically conductive layer 53. Moreover, on the rear surface of the polyurethane film 54 is provided an adhesive layer 55. On the adhesive side of the adhesive layer is provided a release liner 56.

The surface material 52 which can be used is the same as the surface material 12 described above. Also, the electrically conductive layer 53 may be the same as the electrically conductive layer 13, and the adhesive layer 55 may be the same as the adhesive layer 14.

In the case where a wavelength region of a portable phone should be shielded, when the horizontal and vertical positions of the electrically conductive layer 53 are arranged so as to be not more than half of the wavelength λ, the electric wave having a desired wavelength such can be shielded. In the case two or more electric waves each having different wavelength are desired to be shielded, when several electrically conductive layers each corresponding to desired electric wavelength are provided, these electric waves can be shielded.

In addition to windows of the constructs, the electric wavelength shielding materials according to the first to the third aspects of the present invention can be stuck to window portions of automobiles, trains such as super express, airplane, etc. The adhesive layer is not necessarily provided over the whole surface of the electric wave shielding material, and the adhesive layer is partially provided in such an extent that the electric wave shielding material is stuck to and fixed to the surface of the object

EXAMPLES

The present invention will now be described with reference to the working examples. However, it should be noted that the present invention never restricted thereto.

In the examples, the following body member of electric wave shielding material and connecting piece were used.
(Body Member of Electric Wave Shielding Material)

A polyethylene terephthalate (PET) film having a thickness of 50 μm was used as a surface material. Onto one surface of the PET film was provided an ITO layer, as an electrically conductive layer, having a thickness of 0.2 μm to provide an assembly. The assembly was cut into a size of 500 mm in length and 500 mm in width, and then an acrylic adhesive comprising polybutylacrylate as main ingredient was applied to the ITO layer so as to leave a margin having a size of 500 mm in length and 10 mm in width from the end portion to thereby form an acrylic adhesive layer having a thickness of 25 μm. Onto the adhesive layer thus formed was applied a 38 μm thick PET film having a size of 500 mm in length and 500 mm in width to which a releasing treatment with a silicone resin had been applied to produce a body of the electric wave shielding material.
(Connecting Piece)

Onto a 38 μm thick PET film having a size of 500 mm in length and 10 mm in width to which a releasing treatment with a silicone resin had been applied, an electrically conductive adhesive comprising 30% by weight of an acrylic adhesive comprising polybutylacrylate as main ingredient having 70% by weight of nickel powder uniformly dispersed therewith was applied so as to form an electrically conductive adhesive layer having a thickness after drying of 25 μm. Separately, a polyurethane resin solution was prepared by mixing 145 parts by weight of a 65% Takelac A-540 solution with a 18 parts by weight of 70% Takenate solution A-12 (both available from TAKEDA CHEMICAL INDUSTRIES LTD.) and stirring the mixture. The polyurethane solution in an amount of 60 parts by weight was mixed and stirred with 40 parts by weight of carbon powder. The mixture was applied onto the electrically conductive layer so as to form a member for converting an electric wave to a heat energy having a dry thickness of 40 μm (dried at 100° C. for 30 minutes) . The connecting piece was produced by applying an electrically conductive adhesive composed of 30% by weight of an adhesive comprising polybutylacrylate as main ingredient and 70% by weight of nickel powder onto the member for converting an electric wave to a heat energy formed as described above so as to form an electrically adhesive layer having a thickness of 25 μm after drying.

Example 1

To a window glass comprising an aluminum-made frame and a 3 mm thick soft glass having a size of 500 mm in length and 500 mm in width, the connecting piece produced as described above was stuck such a manner that the connecting piece was in contact with the frame, as the release liner was gradually peeled off. Further, the release liner of the body of the electric wave shielding material was peeled off, and the body was stuck to the window glass via an adhesive layer provided on the surface material so as to overlap the rear surface of the electrically conductive layer with the electrically conductive adhesive portion of the connecting piece.

Example 2

An electric wave shielding material was produced by peeling the release liner of the body of the electric wave shielding material and laminating it with the connecting piece such a manner that the rear surface of the connecting electrically conductive portion was overlapped with the electrically conductive adhesive layer of the connecting piece. After the release liner of the connecting piece portion had been peeled off, the adhesive layer of the electric wave shielding material was stuck to the same window glass as described in Example 1 in such a manner that the connecting piece portion was in contact with the frame of the window.

The conditions of the decrease in electric waves were examined for the windows to which the electric wave shielding materials had been stuck (exemplified windows 1 and 2, respectively) and for comparative window to which no electric wave shielding materials had been stuck (comparative window) as follows:

A transmitting antenna was set up on an outside of each of the windows and a receiving antenna was set up on an inside of the each of the windows, while setting the distance between a transmitting antenna and a receiving antenna at 1 m. Subsequently, electric waves each having a frequency as shown in Table 1 were transmitted to each of the windows, and the decreases in electric waves at the receiving antenna were examined by the use of a NETWORK-ANALYZER-MS4662A (produced by ANRITSU Corporation). The results are shown in Table 1.

TABLE 1

Decreases in Electric Waves

| | Exemplified Window 1 | Exemplified Window 2 | Comparative Window |
|---|---|---|---|
| 10 MHz | 35 db | 35 db | None |
| 100 MHz | 29 db | 29 db | None |
| 1,000 MHz | 26 db | 26 db | None |

Example 3

An electric wave shielding material capable of selectively shielding an electric wave was produced as follows: A polyurethane film (thickness: 500 μm) comprising the polyurethane resin and carbon powder having the same proportion as in the column of the connecting piece was thermally fused onto an aluminum foil (thickness: 10 μm), which was then cut into small pieces each having a size of 50 mm in length and 1 mm in width to form a member for converting an electric wave into a heat energy, provided on the electrically conductive layer. These pieces were stuck to a PET film (thickness: 50 μm) via an adhesive in such a manner the distance between pieces were 10 mm in both directions. Further, an acrylic adhesive was applied over the whole surface of the PET film to produce an electric wave shielding material of Example 3.

As in Examples 1 and 2, the electric shielding material of Example 3 was stuck to the same window glass as in the previous examples, the decrease in the electric wave was examined using the same device as in the previous examples. It was found that a decrease in an electric wave having a frequency of 3 GHz was 25 db.

As described above, the present invention has the following significant effects.

1. Since the electric wave shielding material has a member for converting an electric wave into a heat energy on the rear surface of the electrically conductive layer, the electric wave received by the electrically conductive layer is converted into an heat energy which is discharged to thereby ensure the shielding of the electric wave.

2. When the electric wave shielding material according to the present invention is composed such that a connecting piece having a member for converting an electric wave into a heat energy is separately formed from the body member, and first the connecting piece is stuck to the window glass and then the body member is stuck, it becomes possible to ensure the shielding of the electric wave to be penetrated from the window glass, and the application of the material becomes easy.

3. Since the electric wave shielding material according to the present invention has an electrically conductive layer which resonanted a desired electric wave having a prescribed wavelength region, and has a member for converting an electric wave into a heat energy provided on the electrically conductive layer, a desired electric wave can be selectively shielded and electric waves other than this electric wave can be penetrated.

What is claimed is:

1. An electric wave shielding material provided to be adhered to a window, said material comprises:
   a body member composed of
      a light transmitting surface material;
      a light transmitting electrically conductive layer provided on said light transmitting surface material; and
      a light transmitting adhesive layer provided on at least a part of said light transmitting electrically conductive layer in such a manner that a part of said light transmitting electrically conductive layer is exposed to form a connecting electrically conductive portion; and
   a connecting piece formed separately from said body member, and composed of a member for converting an electric wave into a heat energy being connected to said connecting electrically conductive portion, and having an adhesive layer provided on one surface of said member for converting an electric wave into a heat energy, wherein said member for converting said electric wave into heat energy comprises carbon powder.

2. The electric wave shielding material according to claim 1 in combination with said window, wherein said light transmitting adhesive layer is disposed between said window and said light transmitting electrically conductive layer to adhere said body member to said window.

3. An electric wave shielding material provided to be adhered to a window, said material comprises:

a light transmitting surface material, at least one electrically conductive layer, which resonates at a prescribed wavelength region, provided on one surface of said light transmitting surface material, a member for converting an electric wave into a heat energy provided in such a manner that is connected to said electrically conductive layer, and an adhesive layer provided on a surface of said light transmitting surface material, wherein said member for converting said electric wave into heat energy comprises carbon powder.

4. An electric wave shielding material provided to be adhered to a window, said material comprises:

a light transmitting surface material, a light transmitting electrically conductive layer provided on one surface of said light transmitting surface material, a member for converting an electric wave into a heat energy connected to said light transmitting electrically conductive layer, and a light transmitting adhesive layer provided on at least part of said light transmitting surface material, said electrically conductive layer or said member wherein said member for converting said electric wave into heat energy comprises carbon powder.

5. The electric wave shielding material according to claim 4 in combination with said window, wherein said light transmitting adhesive layer is disposed between said window and said light transmitting electrically conductive layer to adhere said body member to said window.

6. An electric wave shielding material in combination with a window, said material comprises:

a body member composed of
  a light transmitting surface material;
  a light transmitting electrically conductive layer provided on said light transmitting surface material; and
  a light transmitting adhesive layer provided on at least a part of said light transmitting electrically conductive layer in such a manner that a part of said light transmitting electrically conductive layer is exposed to form a connecting electrically conductive portion; and a connecting piece formed separately from said body member, and composed of a member for converting an electric wave into a heat energy being connected to said connecting electrically conductive portion, and having an adhesive layer provided on one surface of said member for converting an electric wave into a heat energy wherein said light transmitting adhesive layer is disposed between said window and said light transmitting electrically conductive layer to adhere said body member to said window and said connecting piece comprises an electrically conductive adhesive layer adhered to said light transmitting electrically conductive layer; a center layer defining said member for converting said electric wave energy to heat energy; and an acrylic adhesive layer adhered to said window, said connecting piece extending adjacent a frame of said window.

7. The electric wave shielding material according to claim 6, wherein said light transmitting surface material is formed of a film of one of polyethylene terephthalate an polyolefin and has a thickness within a range of 10–1000 $\mu$m; said light transmitting electrically conductive layer is composed of one of an indium tin oxide, a metal and an organic electrically conductive agent, and has a thickness within a range of 0.1–10 $\mu$m; and said center layer of said connecting piece is formed of a plastic film of one of a polyurethane, a polyvinyl chloride and a polystyrene incorporating said carbon powder.

8. An electric wave shielding material provided to be adhered to a window, said material comprises:

a light transmitting surface material, at least one electrically conductive layer, which resonates at a prescribed wavelength region, provided on one surface of said light transmitting surface material, a member for converting an electric wave into a heat energy provided in such a manner that it is connected to said electrically conductive layer, and an adhesive layer provided on a surface of said light transmitting surface material, wherein said at least one electrically conductive layer comprises a plurality of spaced apart electrically conductive layers arranged on said light transmitting material so that a distance between said plurality of electrically conductive layers is less than half a wavelength of an electric wave to be shielded and has a width substantially equal to half of said wavelength.

* * * * *